United States Patent
Mimura et al.

(10) Patent No.: US 9,774,001 B2
(45) Date of Patent: Sep. 26, 2017

(54) DISPLAY DEVICE AND METHOD FOR MANUFACTURING DISPLAY DEVICE

(71) Applicant: Japan Display Inc., Tokyo (JP)

(72) Inventors: Toshifumi Mimura, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/092,778

(22) Filed: Apr. 7, 2016

(65) Prior Publication Data

US 2016/0301031 A1 Oct. 13, 2016

(30) Foreign Application Priority Data

Apr. 8, 2015 (JP) ................................. 2015-079420

(51) Int. Cl.
*H01L 51/52* (2006.01)
*H01L 27/32* (2006.01)

(52) U.S. Cl.
CPC ...... *H01L 51/5253* (2013.01); *H01L 27/3258* (2013.01); *H01L 27/3276* (2013.01); *H01L 27/3279* (2013.01); *H01L 51/5228* (2013.01); *H01L 51/5234* (2013.01); *H01L 27/322* (2013.01); *H01L 27/3213* (2013.01); *H01L 27/3246* (2013.01); *H01L 51/5218* (2013.01); *H01L 2251/5315* (2013.01)

(58) Field of Classification Search
CPC ............. H01L 51/5253; H01L 51/5228; H01L 27/3276; H01L 51/5234; H01L 27/3279; H01L 27/3258; H01L 51/5218; H01L 27/3213; H01L 27/3246; H01L 27/322; H01L 2251/5315
See application file for complete search history.

(56) References Cited

U.S. PATENT DOCUMENTS

| | | | |
|---|---|---|---|
| 9,331,310 B2 * | 5/2016 | Chida | ................ H01L 51/5237 |
| 2004/0137142 A1 | 7/2004 | Nishikawa | |
| 2012/0061665 A1 * | 3/2012 | Miyake | ............... H01L 27/1225 257/43 |
| 2013/0288426 A1 * | 10/2013 | Akimoto | ........... H01L 29/66765 438/104 |

FOREIGN PATENT DOCUMENTS

| | | |
|---|---|---|
| JP | 2004-165068 A | 6/2004 |
| JP | 2007-108469 A | 4/2007 |

OTHER PUBLICATIONS

Korean Office Action dated Jul. 21, 2017 for corresponding Korean Patent Application No. 10-2016-0039283, with translation.

* cited by examiner

*Primary Examiner* — William Coleman
(74) *Attorney, Agent, or Firm* — Typha IP LLC

(57) ABSTRACT

A display device includes a pixel provided in each of a plurality of pixels; a common electrode provided commonly to the plurality of pixels; an organic layer provided between the pixel electrode and the common electrode; a first insulating layer provided on the common electrode; a common potential line provided below the organic layer in an area where the first insulating layer, the common electrode and the organic layer are provided in a stacked manner; a contact electrode provided in an opening running through the first insulating layer, the common electrode and the organic layer, the contact electrode being provided on the common potential line; and a second insulating layer covering the first insulating layer and the contact electrode.

17 Claims, 22 Drawing Sheets

DISPLAY DEVICE AND METHOD FOR MANUFACTURING DISPLAY DEVICE

CROSS REFERENCE TO RELATED APPLICATIONS

This application is based upon and claims the benefit of priority from the prior Japanese Patent Application No. 2015-79420 filed on Apr. 8, 2015, the entire contents of which are incorporated herein by reference.

FIELD

The present invention relates to a display device including a light-emitting element that includes a patterned organic layer and a method for manufacturing such a display device.

BACKGROUND

An organic electroluminescence (hereinafter, referred to as "organic EL") display device includes a light-emitting element provided in each of a plurality of pixels and displays an image by controlling light emission of each of the light-emitting elements individually. The light-emitting element has a structure in which a layer containing an organic EL material (hereinafter, also referred to as an "organic layer") is interposed between a pair of electrodes, one of which is an anode and the other of which is a cathode. In such an organic EL display device, one of the electrodes is provided in each pixel as a pixel electrode, and the other electrode is provided over the plurality of pixels as a common electrode applied with a common voltage. In the organic EL display device, a voltage is applied to the pixel electrode in each of the pixels individually to control the amount of electric current flowing in the light-emitting layer and thus to control the light emission of each of the pixels.

Usually in a manufacturing process of such an organic EL display device, a metal mask is used to form an organic layer. The organic layer is formed by patterning performed by use of a metal mask. For example, Japanese Laid-Open Patent Publication No. 2004-165068 discloses a method for forming an organic layer by a vacuum vapor deposition method by use of a metal mask having an opening for each of pixels.

Use of a metal mask requires dedicated equipment and periodical maintenance.

In addition, use of a metal mask includes the following problem. During a patterning step, a substrate and the metal mask may contact each other, which may generate particles. Such particles, together with moisture entering the inside of the display device, decrease the performance of the light-emitting element. This shortens the life of the display device.

In such a case, a manufacturing process using no metal mask to pattern the organic layer (so-called maskless process) is desired. Such a process is expected to decrease the manufacturing cost.

According to one maskless process that has been explored, an organic film acting as a light-emitting layer is patterned by laser ablation. This method removes unnecessary parts of the organic film by laser in a patterning step. However, since a cathode film and a sealing film are formed after the patterning step, parts of the organic film scattered by the laser ablation become particles in a later step and may cause dark spots.

An organic EL display device including an organic EL layer as a light-emitting layer has the following problem. The organic EL layer is very weak against moisture. If moisture enters the display device from outside and reaches the organic EL layer, dark spots may be generated. Such an organic EL display device uses an organic material such as an acrylic resin, a polyimide resin for an organic planarization film or a bank. Such an organic material acts as a path that transfers moisture. Thus, moisture entering from outside may reach the organic EL layer and deteriorate the display device.

SUMMARY

A display device in an embodiment according to the present invention includes: a pixel electrode provided in each of a plurality of pixels; a common electrode provided commonly to the plurality of pixels; an organic layer provided between the pixel electrode and the common electrode; a first insulating layer provided on the common electrode; a common potential line provided below the organic layer in an area where the first insulating layer, the common electrode and the organic layer are provided in a stacked manner; a contact electrode provided in an opening running through the first insulating layer, the common electrode and the organic layer, the contact electrode being provided on the common potential line; and a second insulating layer covering the first insulating layer and the contact electrode.

A display device in another embodiment according to the present invention includes: a pixel electrode provided in each of a plurality of pixels; an organic layer provided on the pixel electrode; a common electrode provided on the organic layer commonly to the plurality of pixels; a first insulating layer provided on the common electrode; an inorganic insulating layer provided below the organic layer in an area where the first insulating layer, the common electrode and the organic layer are provided in a stacked manner; a contact electrode provided in an opening running through the first insulating layer, the common electrode and the organic layer, the contact electrode being provided on the inorganic insulating layer in a peripheral area enclosing the plurality of pixels; and a second insulating layer covering the first insulating layer and the contact electrode.

A method for manufacturing a display device in an embodiment according to the present invention includes: forming a plurality of pixel electrodes on a first surface of a substrate; forming a common potential line on the first surface of the substrate; forming an organic layer on an entire surface of the substrate so as to cover the plurality of pixel electrodes and the common potential line; forming a common electrode on the organic layer; forming a first insulating layer on the common electrode; forming an opening reaching the common potential line; forming a contact electrode in the opening; and forming a second insulating layer so as to cover the first insulating layer and the contact electrode. The opening may be formed by directing laser light from the side of the first surface of the substrate.

A method for manufacturing a display device in another embodiment according to the present invention includes forming an insulating layer on a first surface of a substrate; forming a plurality of pixel electrodes on the insulating layer; forming an organic layer on an entire surface of the substrate so as to cover the plurality of pixels; forming a common potential line on the organic layer; forming a first insulating layer on the common electrode; forming an opening reaching the insulating layer in a peripheral area enclosing the plurality of pixel electrodes; forming a contact electrode in the opening; and forming a second insulating layer so as to cover the first insulating layer and the contact electrode.

DESCRIPTION OF EMBODIMENTS

Figure 1:
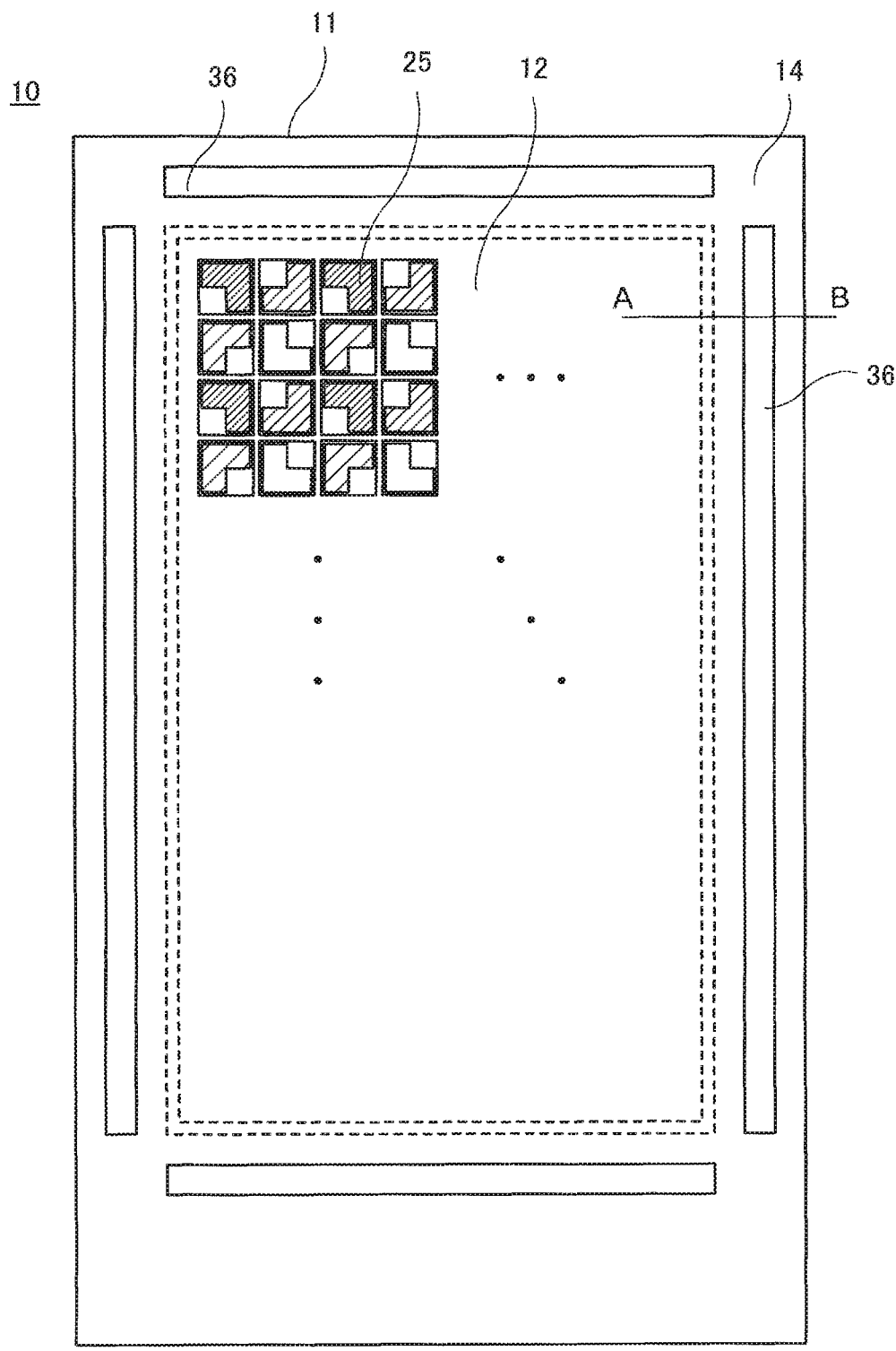
FIG. 1 is a plan view showing a general structure of a display device 10 in an embodiment according to the present invention.

Hereinafter, embodiments of the present invention will be described with reference to the drawings and the like. The present invention may be carried out in various many embodiments, and should not be construed as being limited to any of the following embodiments. In the drawings; components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted.

In this specification, an expression that a component or area is "on" another component or area encompasses a case where such a component or area is in contact with the another component or area and also a case where such a component or area is above or below the another component or area, namely, a case where still another component or area is provided between such a component or area and the another component or area, unless otherwise specified.

Embodiment 1

Figure 2:
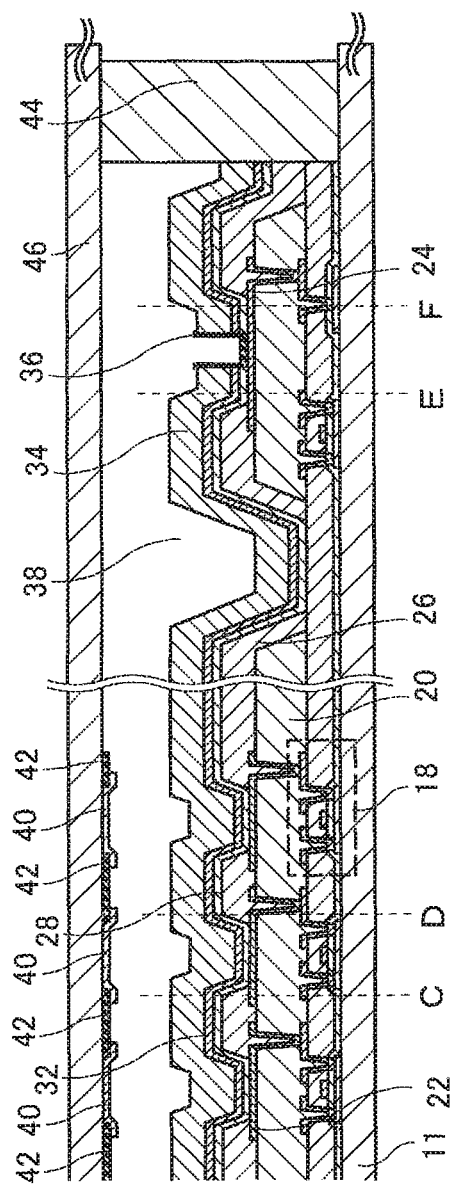
FIG. 2 is a cross-sectional view showing a general structure of a display device 10 in the embodiment according to the present invention.

With reference to FIG. 1 and FIG. 2, a structure of a display device 10 of embodiment 1 according to the present invention will be described. FIG. 1 is a plan view showing the structure of the display device 10 of embodiment 1 according to the present invention. FIG. 2 is a cross-sectional view showing the structure of the display device 10 in embodiment 1 according to the present invention. The display device 10 of this embodiment includes a substrate 11 and a display area 12 forming a display screen. The display area 12 is located on a first surface of the substrate 11. An area other than the display area 12 on the substrate 11 is a peripheral area 14, and the display device 10 includes, in the peripheral area 14, contact electrodes 36 connecting a common electrode 32 and a common potential line 24 (both described later) to each other. In the peripheral area 14, a vertical scanning circuit, a horizontal circuit, a driver IC and the like usable to input a signal to the display area 12 may be further provided.

In the display area 12, a plurality of pixels are arrayed in a matrix form. The plurality of pixels each include a sub pixel emitting red light, a sub pixel emitting green light, a sub pixel emitting blue light, and a sub pixel emitting white light. In FIG. 1, pixels arrayed in a matrix form are shown as an example. In the example shown in FIG. 1, each pixel includes four sub pixels each including an L-shaped light-emitting region, and the four sub pixels of each pixel emits light of different colors from each other. The light-emitting region is not limited to having such a shape and may have any other shape. Hereinafter, "sub pixel" is referred to as merely "pixel".

FIG. 2 shows a cross-sectional structure of the display device 10 shown in FIG. 1 taken along line A-B in FIG. 1. As shown in FIG. 2, the plurality of pixels included in the display device 10 each include a transistor 18 and a light-emitting element. The light-emitting element may be, for example, an organic EL light-emitting element. The organic EL light-emitting element includes a pixel electrode 22 provided in each pixel, the opposite electrode (the opposite electrode will be referred to as the "common electrode 32") facing the pixel electrode 22, and an organic layer 28 provided between the pixel electrode 22 and the common electrode 32. The organic layer 28 is formed of an organic material. One pixel electrode 22 is individually provided in each pixel, and is connected with the transistor 18. The common electrode 32 is commonly provided over the plurality of pixels. The organic layer 28 includes a light-emitting layer, and emits light by an electric current flowing between the common electrode 32 and the pixel electrode 22.

A bank 26 is provided between each two pixels adjacent to each other. The bank 26 is provided such that an end thereof covers an edge of the pixel electrode 22. The bank 26 is preferably formed of an insulating material, for example, an organic material such as a polyimide or an acrylic resin, or an inorganic material such as silicon oxide. Provision of the bank 26 formed of an insulating material prevents the common electrode 32 and the pixel electrode 22 from short circuiting at an end of the pixel electrode 22 and also insulates the adjacent pixels from each other with certainty.

The display device 10 in this embodiment has a so-called top-emission type structure, in which light emitted by the light-emitting element is output toward the side of the common electrode 32. The display device 10 is of a top-emission type in this embodiment, but is not limited to being of this type. The present invention is applicable to a display device of a so-called bottom-emission type, in which light emitted by the light-emitting element is output toward the side of the pixel electrode 22. The pixel electrode 22 is preferably formed of a metal film having a high reflectance in order to allow light emitted from the organic layer 28 to be reflected toward the common electrode 32. Alternatively, the pixel electrode 22 may have a stack structure of a metal film and a transparent conductive film, so that the pixel electrode 22 includes a light-reflective surface. The common electrode 32 is preferably formed of a transparent conductive material such as ITO (tin oxide-containing indium oxide), IZO (indium oxide-zinc oxide) in order to allow light emitted from the organic layer 28 to be transmitted through the common electrode 32. Alternatively, the common electrode 32 may be formed of a metal layer having such a thickness that allows the light emitted from the organic layer 28 to be transmitted through the metal layer. A sealing film 34 (corresponding to a first insulating layer) may be preferably provided on the common electrode 32. The sealing film 34 may be any insulating film that prevents transfer of moisture, and may be formed of, for example, a silicon nitride or the like.

The organic layer 28 formed of, for example, an organic material, is formed of a low molecular-weight type organic material or a high molecular-weight type organic material. In the case where a low molecular-weight type organic material is used, the organic layer 28 includes the light-emitting layer and also a hole-injection layer/hole-transport layer and an electron-transport layer/electron-injection layer. The organic layer 28 may emit red (R), green (G) and blue (B) light or emit white light.

The display device 10 of this embodiment includes the contact electrode 36 in the peripheral area 14 on the substrate 11. In the above-described layer structure of the display device 10 in this embodiment, the common electrode 32 is located on the common potential line 24 with the organic layer 28 provided therebetween. The contact electrode 36 is provided in an opening passing through the sealing film 34, the common electrode 32 and the organic layer 28, and allows the common electrode 32 to be connected with one of two ends of the common potential line 24. The other end of the common potential line 24 is connected with a circuit layer including the transistor 18 and the like. The contact electrode 36 having such a structure allows the common electrode 32 to be supplied with a common potential via the common potential line 24.

The contact electrode 36 may be provided to fill the opening or to be attached to a side wall and a bottom of the opening.

A plurality of contact electrodes 36 may be provided at a plurality of locations, or may have a longitudinal shape with a certain length.

The contact electrode 36 having such a structure allows the common electrode 32 and the common potential line 24 to be connected with each other and thus forms a junction portion with a low resistance. In the case where the resistance of a line or the contact resistance between lines is high, there is a problem that a sufficient amount of electric current does not flow and thus light-emitting elements located at different positions in the display area have different amount of light emission (so-called shading). However, the contact electrode 36 having the structure according to the present invention suppresses this problem.

The contact electrode 36 and the sealing film 34 may be covered with a passivation layer 37 described later. The passivation layer 37 may be formed of an inorganic insulating material or an organic insulating material. Inorganic insulating materials usable for the passivation layer 37 include $SiO_x$, $SiN_x$, $SiO_xN_y$, $SiN_xO_y$, $AlO_x$, $AlN_x$, $AlO_xN_y$, $AlN_xO_y$, TEOS or the like (x and y are each an arbitrary value). The passivation layer 37 may have a stack structure of any of these materials. Organic insulating materials usable for the passivation layer 37 include a polyimide resin, an acrylic resin, an epoxy resin, a silicone resin, a fluorine resin, a siloxane resin and the like. The passivation layer 37 may have a stack structure of any of these materials. The passivation layer 37 may have a stack structure of any of the above-described inorganic insulating materials and any of the above-described organic insulating materials.

The substrate 11 is covered with a transparent opposite substrate 46 that is kept away by a certain distance from the substrate 11 by a sealing member 44. A space enclosed by the opposite substrate 46, the sealing member 44 and the sealing film 34 is filled with a filler 38 formed of a transparent epoxy resin.

Modification 1

Figure 7:
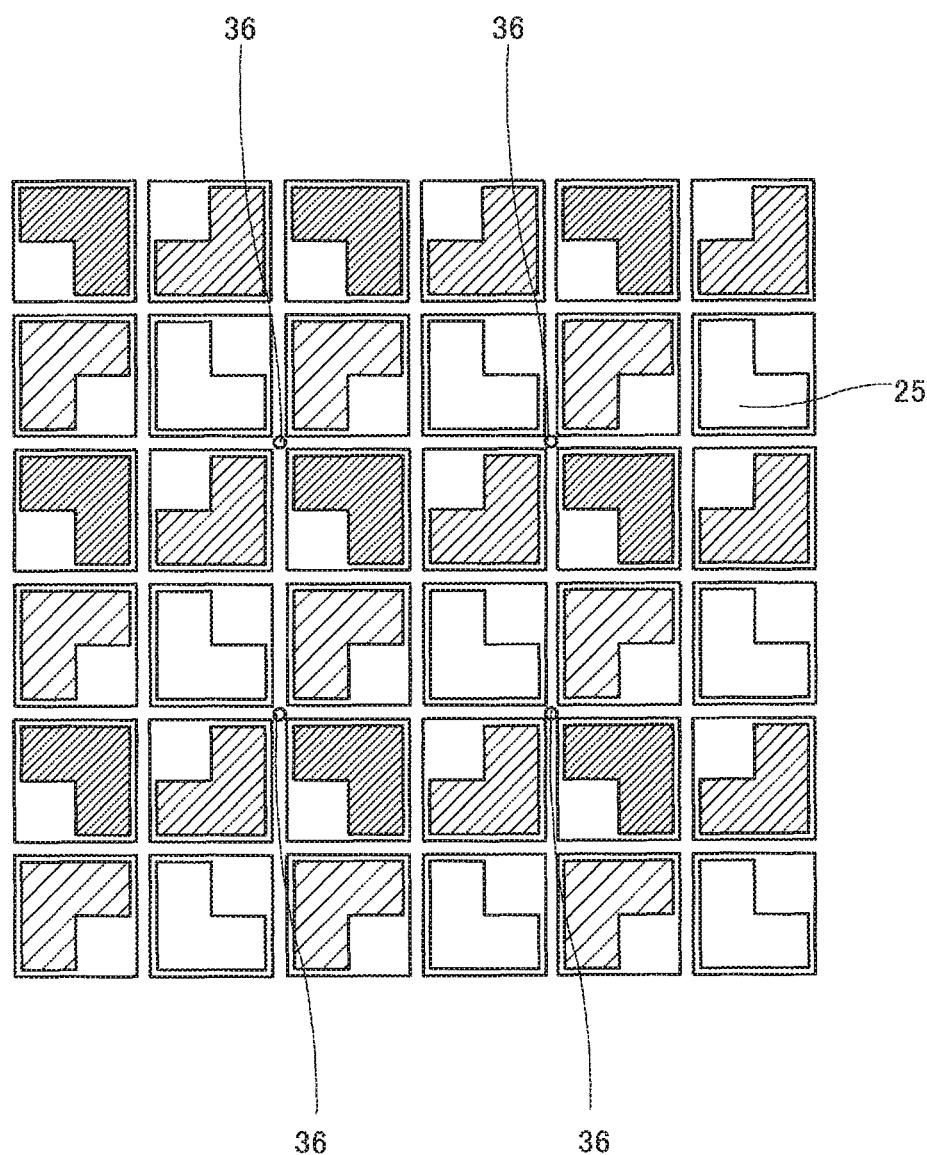
FIG. 7 is a plan view showing a general structure of a display device 10 in a modification of an embodiment according to the present invention.

In a modification of embodiment 1, a plurality of contact electrodes 36 may be located in the display area 12. For example, as shown in FIG. 7, a plurality of contact electrodes 36 may be provided between a plurality of pixels located in the display area 12. Embodiment 1 and modification 1 may be combined such that a plurality of contact electrodes 36 are provided in the peripheral area 14 on the substrate 11 and between a plurality of pixels located in the display area 12. Such an arrangement of the contact electrodes 36 shortens the distance between a part of the common electrode 32 that is in each of the pixels and the common potential line 24 and thus suppresses voltage drop between the pixels and the common potential line 24. This suppresses the above-described problem of shading. This effect is more conspicuous as the display area 12 is larger.

Modification 2

Figure 8:
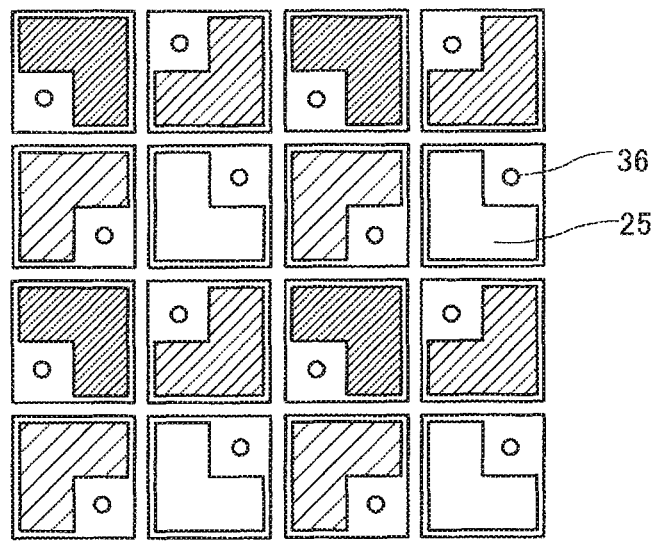
FIG. 8 is a plan view showing a general structure of a display device 10 in another modification of an embodiment according to the present invention.

In another modification of embodiment 1, as shown in FIG. 8, a plurality of contact electrodes 36 may be provided in a plurality of pixels located in the display area 12. In this case, the contact electrodes 36 may be provided in all the pixels or in a part of the pixels. In the case where being provided in the pixels, the contact electrodes 36 are located so as to avoid a connection portion of the pixel electrode 22 and the transistor 18. Alternatively, embodiment 1, modification 1 and modification 2 may be combined in any way. Such an arrangement of the contact electrodes 36 further shortens the distance between a part of the common electrode 32 that is in each of the pixels and the common potential line 24 and thus further suppresses voltage drop between the pixels and the common potential line 24. This further suppresses the above-described problem of shading.

Manufacturing Method in Embodiment 1

FIG. 3A through FIG. 3H are cross-sectional views showing a method for manufacturing the display device 10 in embodiment 1, and each show areas corresponding to areas represented by lines C-D and E-F in FIG. 2. With reference to FIG. 3A through FIG. 3H, a method for manufacturing the display device 10 in embodiment 1 will be described. In embodiment 1, a process including formation of peripheral circuits including the transistor 18 and formation of an organic planarization film 20 is omitted.

Figure 3A:
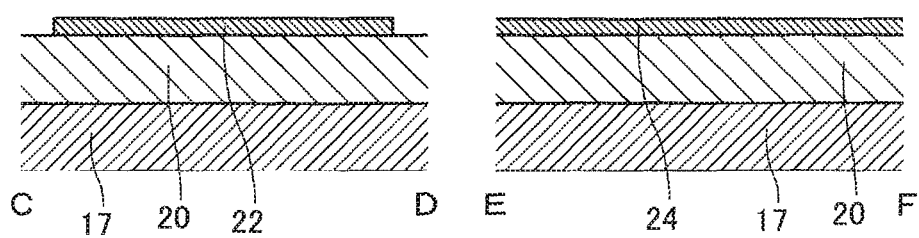
FIG. 3A is a cross-sectional view showing a method for manufacturing the display device 10 in the embodiment according to the present invention.

FIG. 3A shows a structure after the pixel electrode 22 and the common potential line 24 are formed on the organic planarization film 20. The organic planarization film is formed on the inorganic insulation layer 17 which includes transistor 18. The pixel electrode 22 and the common potential line 24 are formed by photolithography. The pixel electrode 22 and the common potential line 24 may be formed of different metal materials, and either the pixel electrode 22 or the common potential line 24 may be formed first. Alternatively, the pixel electrode 22 and the common potential line 24 may be formed of the same metal material in the same patterning step.

Figure 3B:
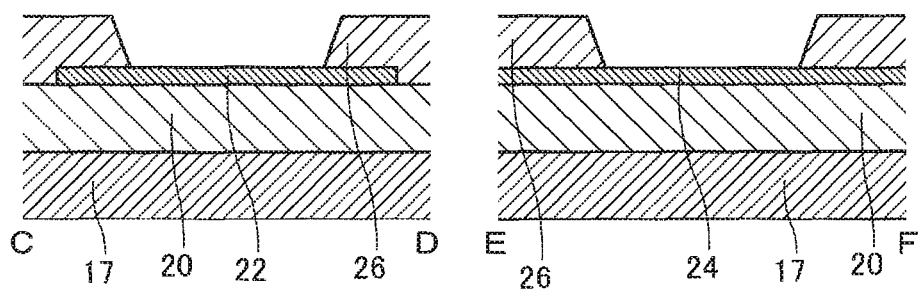
FIG. 3B is a cross-sectional view showing the method for manufacturing the display device 10 in the embodiment according to the present invention.

Especially in the display area 12, the bank 26 is formed so as to cover an edge of the pixel electrode 22 (FIG. 3B). The bank 26 is formed of an insulating material, for example, an organic material or an inorganic material. Usable organic materials include a polyimide resin, an acrylic resin and the like. Usable inorganic materials include silicon oxide and the like.

Figure 3C:
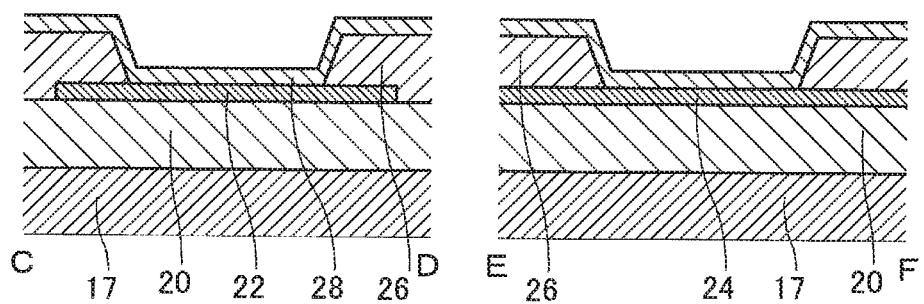
FIG. 3C is a cross-sectional view showing the method for manufacturing the display device 10 in the embodiment according to the present invention.

The organic layer 28 is formed on the entire surface of the display area 12 (FIG. 3C). In this and the following descriptions of method for manufacturing the display device, an assembly of the substrate 11 and the component(s) formed thereon at each step will be referred to as the "substrate" for the sake of convenience. In embodiment 1, the organic layer 28 includes only the light-emitting layer. Alternatively, the organic layer 28 may include functional layers such as an electron-injection layer, an electron-transport layer, a hole-injection layer, a hole-transport layer, and these functional layers may be formed by vapor deposition using a vapor deposition mask used for forming the light-emitting layer.

Figure 3D:
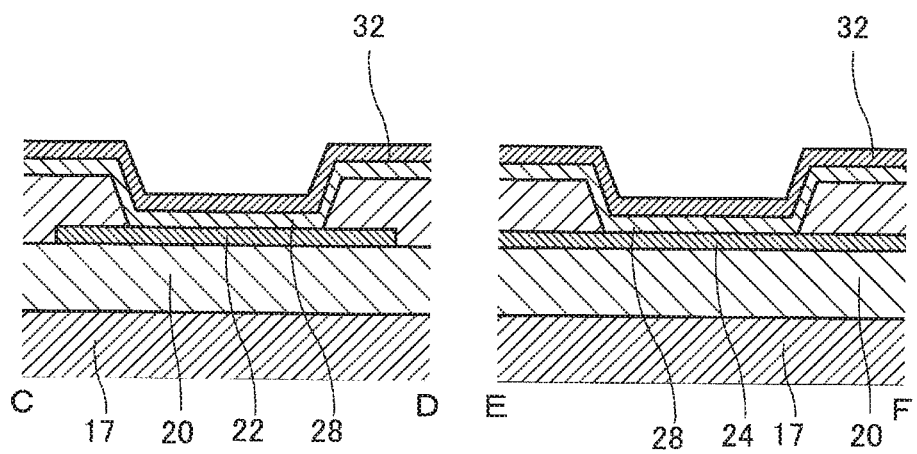
FIG. 3D is a cross-sectional view showing the method for manufacturing the display device 10 in the embodiment according to the present invention.

A transparent electrode layer acting as the common electrode 32 is formed on the entire surface of the substrate (FIG. 3D). The common electrode 32 is preferably formed of a transparent conductive material that is light-transmissive such as ITO or IZO. Alternatively, the common electrode 32 may be formed of a metal layer having such a thickness that allows the light emitted from the organic layer 28 to pass through the metal layer.

Figure 3E:
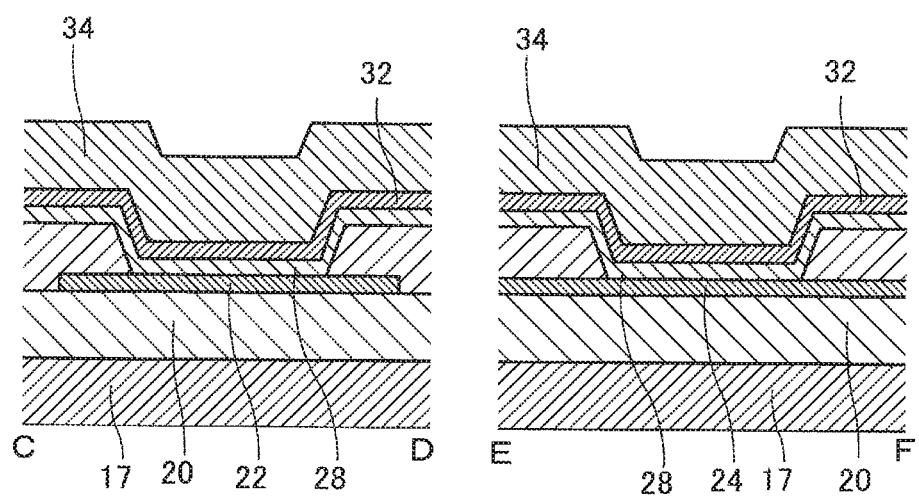
FIG. 3E is a cross-sectional view showing the method for manufacturing the display device 10 in the embodiment according to the present invention.

The sealing film 34 is formed on the entire surface of the substrate (FIG. 3E). The sealing film 34 may be any insulating film that prevents transfer of moisture, and may be formed of, for example, silicon nitride or the like.

Figure 3F:
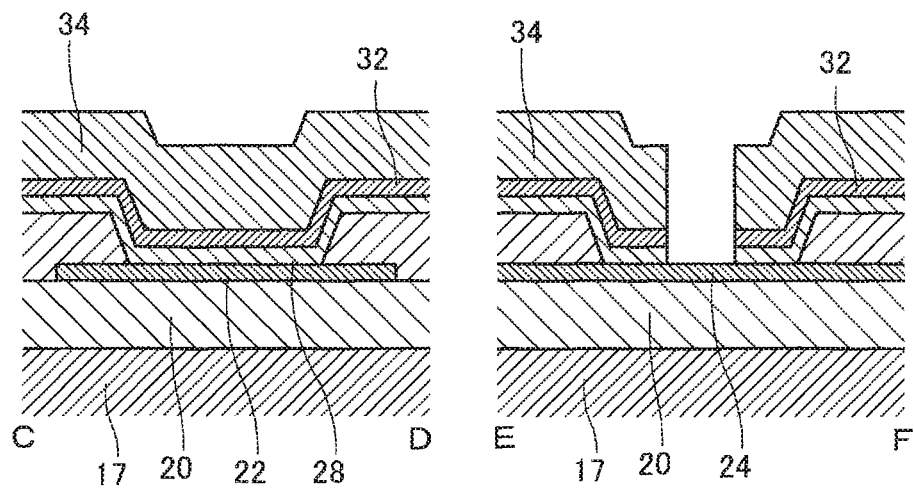
FIG. 3F is a cross-sectional view showing the method for manufacturing the display device 10 in the embodiment according to the present invention.

After the organic layer 28, the common electrode 32 and the sealing film 34 are formed, an opening passing through these components to expose the common potential line 24 below the organic layer 28 is formed (FIG. 3F). The opening is formed by laser ablation or photolithography. Laser ablation, which does not use a mask, is preferable.

With the laser ablation, the opening is formed as follows. An area where the contact electrode 36 is to be formed is irradiated with a laser, and this area is instantaneously sublimated. Usable lasers include a KrF excimer laser (wavelength: 248 nm), an ArF excimer laser (wavelength: 193 nm) and the like. The present invention is not limited to using such a laser.

Figure 3G:
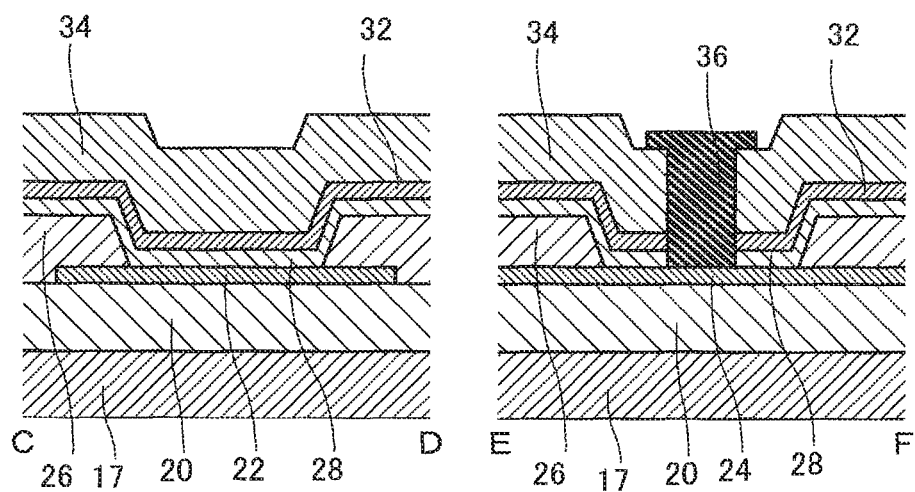
FIG. 3G is a cross-sectional view showing the method for manufacturing the display device 10 in the embodiment according to the present invention.

In the opening, the contact electrode 36 is formed (FIG. 3G). The contact electrode 36 is preferably formed by, for example, a laser CVD method or an inkjet method. Use of the laser CVD method tends to form a structure in which a metal material is deposited on a side wall and a bottom of the opening. Use of the inkjet method tends to form a structure in which the opening is filled with a metal material.

Figure 3H:
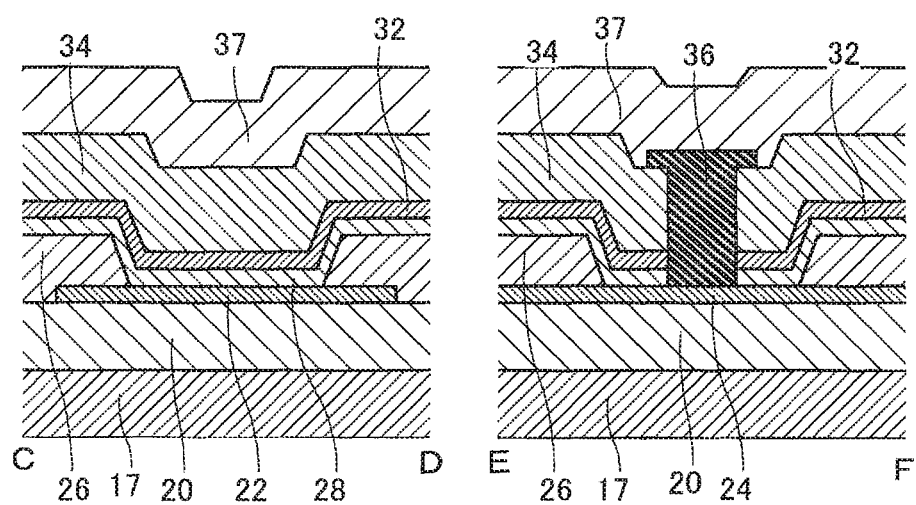
FIG. 3H is a cross-sectional view showing the method for manufacturing the display device 10 in the embodiment according to the present invention.

The passivation layer 37 is formed (FIG. 3H). The contact electrode 36 and the sealing film 34 are covered with the passivation layer 37. The passivation layer 37 may be formed of an inorganic insulating material or an organic insulating material. Inorganic insulating materials usable for the passivation layer 37 include $SiO_x$, $SiN_x$, $SiO_xN_y$, $SiN_xO_y$, $AlO_x$, $AlN_x$, $AlO_xN_y$, $AlN_xO_y$, TEOS or the like (x and y are each an arbitrary value). The passivation layer 37 may have a stack structure of any of these materials. Organic insulating materials usable for the passivation layer 37 include a polyimide resin, an acrylic resin, an epoxy resin, a silicone resin, a fluorine resin, a siloxane resin and the like. The passivation layer 37 may have a stack structure of any of these materials. The passivation layer 37 may have a stack structure of any of the above-described inorganic insulating materials and any of the above-described organic insulating materials.

In the case where the passivation layer 37 has a stacking structure of a plurality of materials, transfer of moisture is further prevented. For example, the passivation layer 37 may have a three-layer structure, and a first insulating film (corresponding to a second insulating layer of the display device 10) is formed of an inorganic insulating material. The use of only the first insulating film may not provide a sufficient covering function due to convexed portions and concaved portions due to the light-emitting elements in the display area 12 and the contact electrode 36, and thus may form a moisture-transferring path. In order to avoid this, a second insulating film (corresponding to a third insulating layer of the display device 10) is formed to provide a high level of flatness. The second insulating film may be formed of an organic insulating material such as an acrylic resin or an inorganic insulating material such as formed from TEOS. On the flattened second insulating film, a third insulating film (corresponding to a fourth insulating layer of the display device 10) is formed. Because of the flattening effect of the second insulating film, the third insulating film has a high coverage and suppresses formation of a moisture-transferring path. The third insulating film is preferably formed of a highly moisture-shielding material, for example, a silicon nitride or the like.

The opposite substrate 46 is provided, on the resultant assembly, as being away by a certain distance from the substrate 11 by the sealing member 44 (this step is not shown). In FIG. 2, the opposite substrate 46 is formed of glass. Before the opposite substrate 46 is assembled with the substrate 11, a red color filter 40 corresponding to the red sub pixel, a green color filter 40 corresponding to the green sub pixel, a blue color filter 40 corresponding to the blue sub pixel, and a black matrix 42 provided between the color filters 40 are formed on the opposite substrate 46.

The opposite substrate 46 is bonded with the assembly of the substrate 11 and the components formed thereon, by the filler 38 formed of a resin. As a result, the display device 10 shown in FIG. 2 is manufactured. The filler 38 may be formed of a transparent resin such as a polyimide resin, an acrylic resin. After being provided between the opposite substrate 46 and the assembly of the substrate 11 and the components formed thereon, the filler 38 may be cured with light. The sealing member 44 may be provided with a bonding function.

According to the method for manufacturing the display device 10 in embodiment 1, the organic layer 28 is formed by patterning without a mask. Therefore, the problem that particles are generated due to the contact between the substrate 11 and the mask is avoided. After the organic layer 28 is formed, the common electrode 32 and the sealing film 34 are formed on the organic layer 28, and the organic layer 28, the common electrode 32 and the sealing film 34 are patterned in one step. Therefore, dust generated by the patterning are easily removed. In addition, the number of times of patterning is decreased. These improve the yield and productivity.

Embodiment 2

The display device 10 uses an organic material such as an acrylic resin, a polyimide resin for the organic planarization film 20 and the bank 26. Such an organic material forms a moisture-transferring path, and especially in an organic EL display device, allows moisture entering from outside to reach the light-emitting element and deteriorate the display device. In order to avoid this problem, a moisture shielding region 16 (FIG. 4) that separates organic films such as the organic planarization film 20 and the bank 26 in the display area 12 from an organic film in another area may be provided, so that a moisture-transferring path from the outside of the display device to the display area 12 is blocked.

Figure 4:
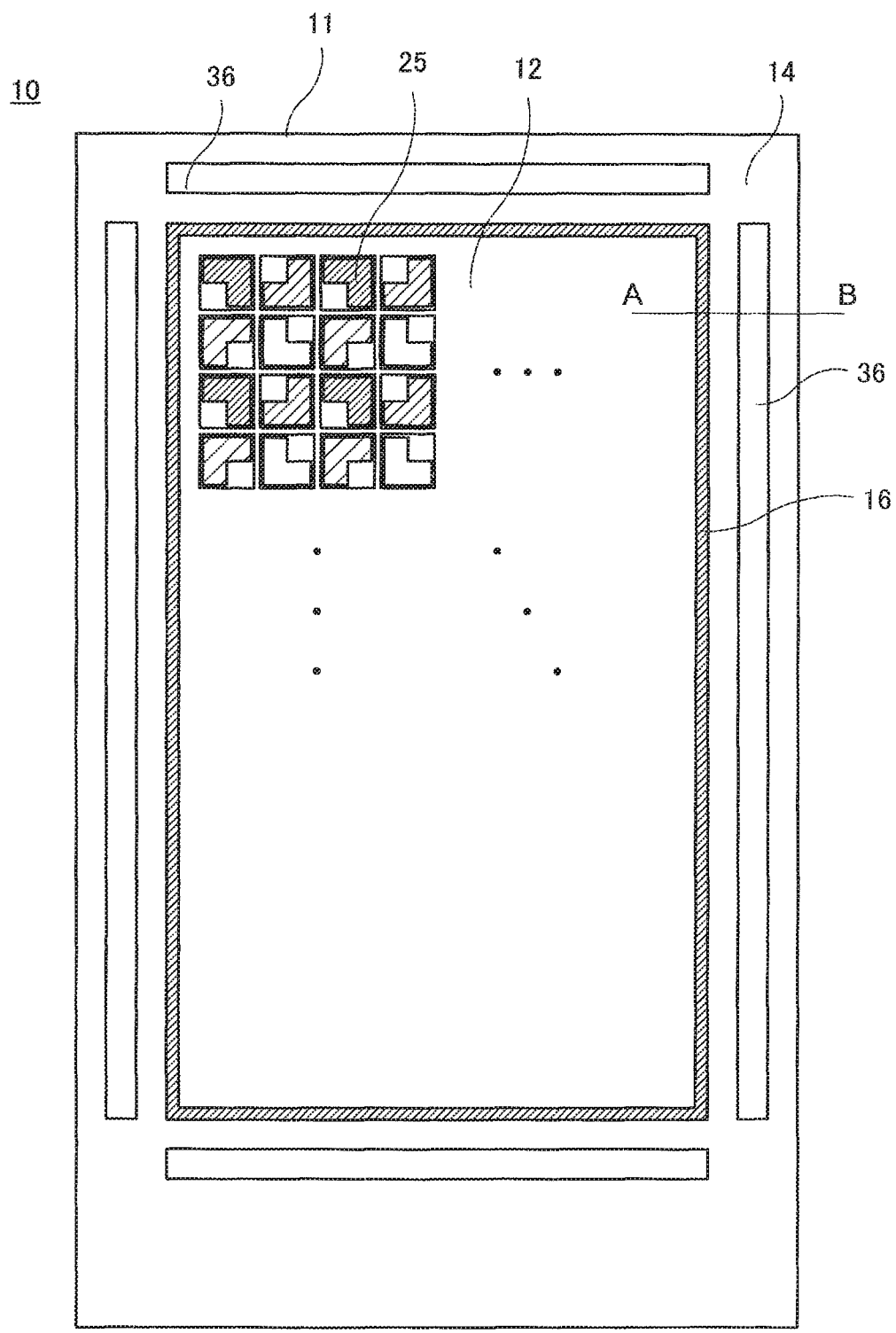
FIG. 4 is a plan view showing a general structure of a display device 10 in another embodiment according to the present invention.
Figure 5:
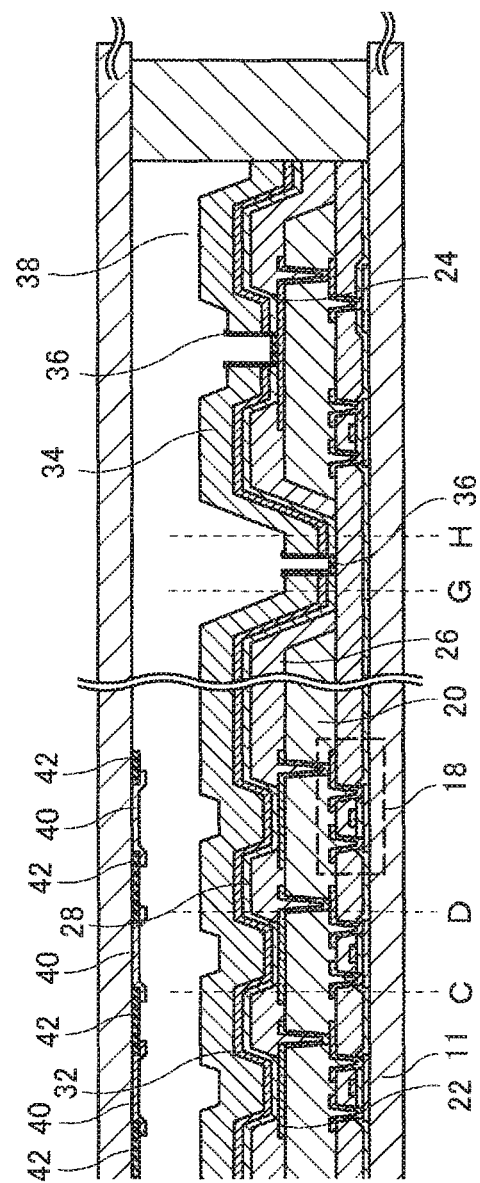
FIG. 5 is a cross-sectional view showing a general structure of a display device 10 in the another embodiment according to the present invention.

In embodiment 1, the organic layer 28, the common electrode 32 and the sealing film 34 are patterned by laser ablation to form the opening in which the contact electrode 36 is to be formed. The laser ablation is usable to form an opening along the moisture shielding region 16 by patterning at the same time as the opening in which the contact electrode 36 is to be formed. With reference to FIG. 4 and FIG. 5, a structure of a display device 10 in embodiment 2 according to the present invention will be described. FIG. 4 is a plan view showing a structure of the display device 10 in embodiment 2 according to the present invention. FIG. 5 is a cross-sectional view showing a structure of the display device 10 in embodiment 2 according to the present invention. The display device 10 in this embodiment includes the moisture shielding region 16 located to enclose the display area 12, in addition to the components included in the display device 10 in embodiment 1.

FIG. 5 shows a cross-sectional structure of the display device 10 shown in FIG. 2 taken along line A-B in FIG. 4. As shown in FIG. 5, the plurality of pixels included in the display device 10 each include the transistor 18 and the light-emitting element including the organic layer 28. The light-emitting element includes the pixel electrode 22, the common electrode 32 facing the pixel electrode 22, and the organic layer 28 provided between the pixel electrode 22 and the common electrode 32. One pixel electrode 22 is individually provided in each pixel, and is connected with the transistor 18.

In the display device 10 in this embodiment, the moisture shielding region 16 is located to enclose the display area 12 on the substrate 11. As shown in FIG. 5, in this embodiment also, the method for manufacturing the display device 10 does not use a mask. Therefore, the organic layer 28 is formed on the entire surface of the display area 12. This involves an undesirable possibility that the organic layer 28 may act as a moisture-transferring path. In addition to the components included in the display device 10 in embodiment 1, the display device 10 in embodiment 2 includes the moisture shielding region 16 enclosing the display area 12 and also includes a contact electrode 36 passing through a stack structure, in the moisture shielding region 16, of the organic layer 28, the common electrode 32 and the sealing film 34. This structure separates the organic layer 28 in the display area 12 from the organic layer 28 in the area other than the display area 12, and thus suppresses transfer of moisture from outside of the display device 10 to the display area 12.

The contact electrode 36 may be provided to fill the opening formed along the moisture shielding region 16 or to be attached to a side wall and a bottom face of the opening.

The potential of the common electrode 32 in the display area 12 is kept at a potential of the common potential line 24 by the contact electrode 36. In the moisture shielding region 16 also, the contact electrode 36 decreases the resistance of a path from the common electrode 32 in the display area 12 to the common potential line 24. The contact electrode 36 is formed along the moisture shielding region 16 and the common potential is supplied to the common electrode 32, so that the common electrode 32 in the display area 12 has a uniform voltage and thus shading is suppressed.

Manufacturing Method in Embodiment 2

FIG. 6A through FIG. 6H are cross-sectional views showing a method for manufacturing the display device 10 in embodiment 2, and each show areas corresponding to areas represented by lines C-D and G-H in FIG. 5. With reference to FIG. 6A through FIG. 6H, a method for manufacturing the display device 10 in embodiment 2 will be described. Steps common to those in embodiment 1 will not be described in repetition. In embodiment 2, a process including formation of peripheral circuits including the transistor 18 and formation of an organic planarization film 20 is omitted.

Figure 6A:
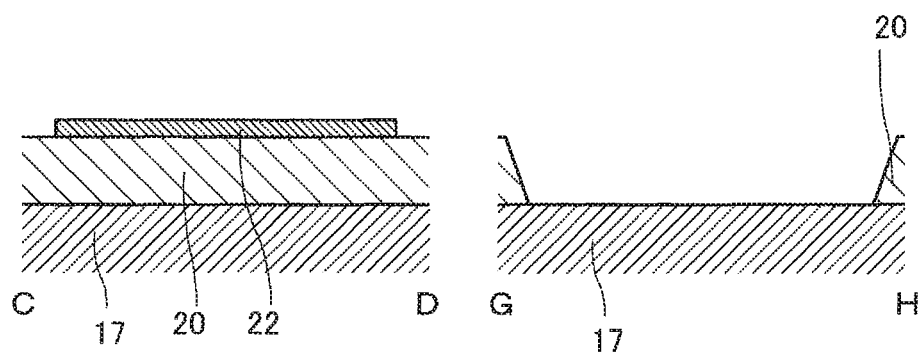
FIG. 6A is a cross-sectional view showing a method for manufacturing the display device 10 in the another embodiment according to the present invention.

FIG. 6A shows a structure after the pixel electrode 22 is formed on the organic planarization film 20 in the display area 12. The pixel electrode 22 is formed by photolithography.

Figure 6B:
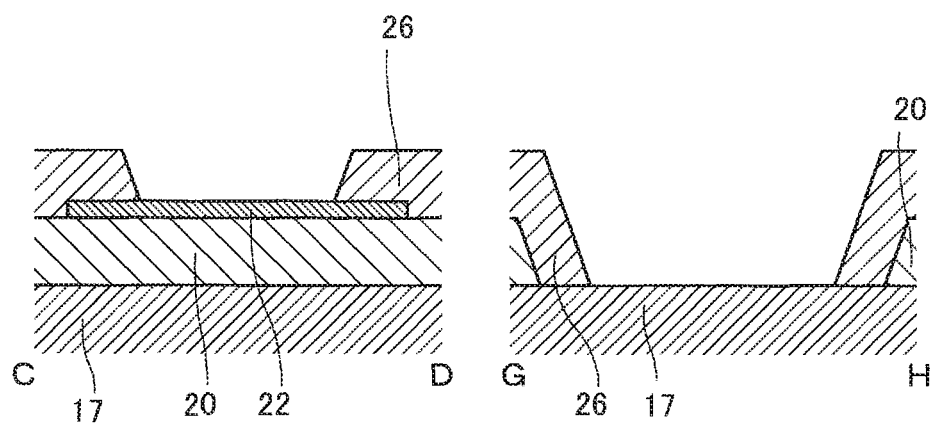
FIG. 6B is a cross-sectional view showing the method for manufacturing the display device 10 in the another embodiment according to the present invention.

In the display area 12, the bank 26 is formed so as to cover an edge of the pixel electrode 22 (FIG. 6B). The bank 26 is formed of an insulating material, for example, an organic material or an inorganic material. Usable organic materials include a polyimide, an acrylic resin and the like. Usable inorganic materials include silicon oxide and the like.

Figure 6C:
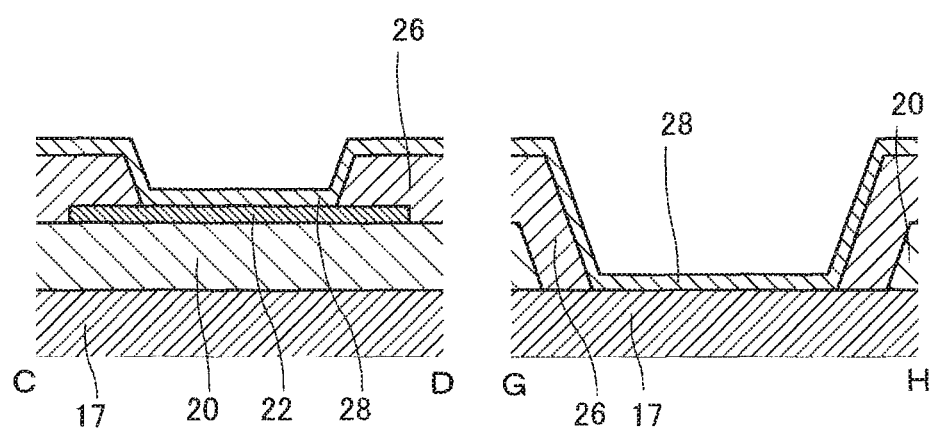
FIG. 6C is a cross-sectional view showing the method for manufacturing the display device 10 in the another embodiment according to the present invention.

The organic layer 28 is formed on the entire surface of the display area 12 (FIG. 6C). In embodiment 2, the organic layer 28 includes only the light-emitting layer. Alternatively, in the case where the light-emitting element is an organic EL element, the organic layer 28 may include functional layers such as an electron injection layer, an electron transfer layer, a hole injection layer, a hole transfer layer, and these functional layers may be formed by vapor deposition using a vapor deposition mask used for forming the light-emitting layer.

Figure 6D:
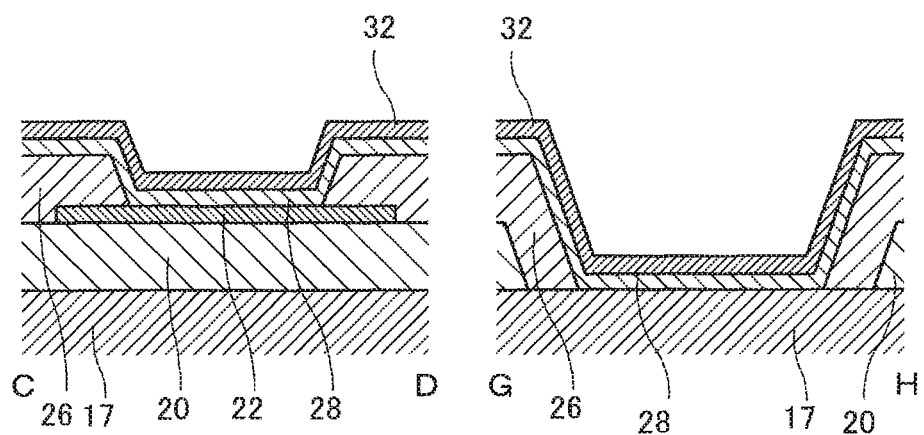
FIG. 6D is a cross-sectional view showing the method for manufacturing the display device 10 in the another embodiment according to the present invention.

A transparent electrode layer acting as the common electrode 32 is formed on the entire surface of the display area 12 (FIG. 6D). The common electrode 32 is preferably formed of a transparent conductive material that is light-transmissive such as ITO or IZO. Alternatively, the common electrode 32 may be formed of a metal layer having such a thickness that allows the light emitted in the organic layer 28 to pass through the metal layer.

Figure 6E:
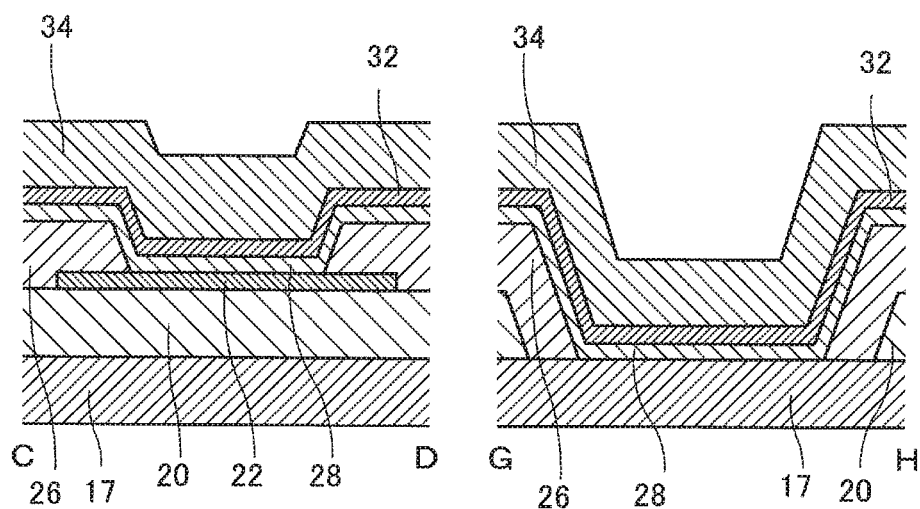
FIG. 6E is a cross-sectional view showing the method for manufacturing the display device 10 in the another embodiment according to the present invention.

The sealing film 34 is formed on the entire surface of the substrate (FIG. 6E). The sealing film 34 may be any insulating film that prevents transfer of moisture, and may be formed of, for example, silicon nitride or the like.

Figure 6F:
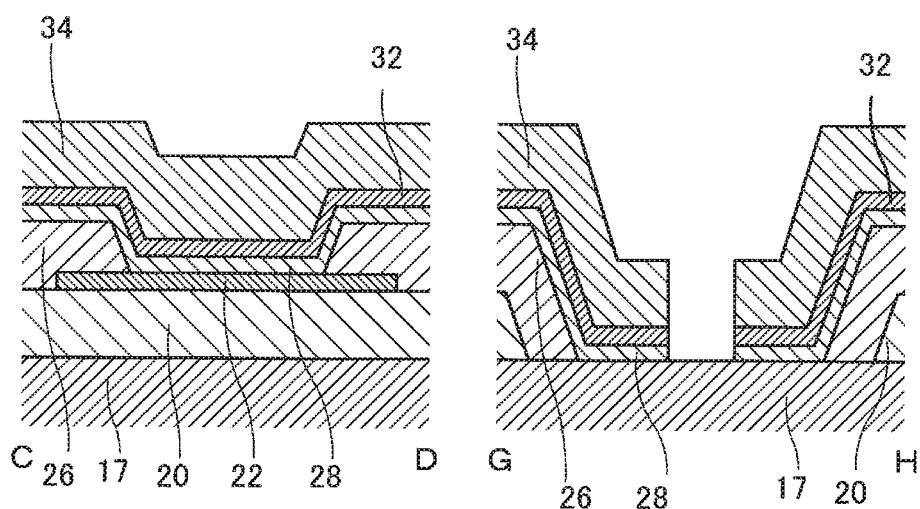
FIG. 6F is a cross-sectional view showing the method for manufacturing the display device 10 in the another embodiment according to the present invention.

After the organic layer 28, the common electrode 32 and the sealing film 34 are formed, an opening passing through these components to expose an insulating film 17 below the organic layer 28 is formed (FIG. 6F). The opening is formed by laser ablation or photolithography. In the present invention, laser ablation, which does not use a mask, is preferable.

With the laser ablation, the opening is formed as follows. An area in which the contact electrode 36 is to be formed is irradiated with laser, and this area is instantaneously sublimated. Usable lasers include a KrF excimer laser (wavelength: 248 nm), an ArF excimer laser (wavelength: 193 nm) and the like. The present invention is not limited to using such a laser.

Figure 6G:
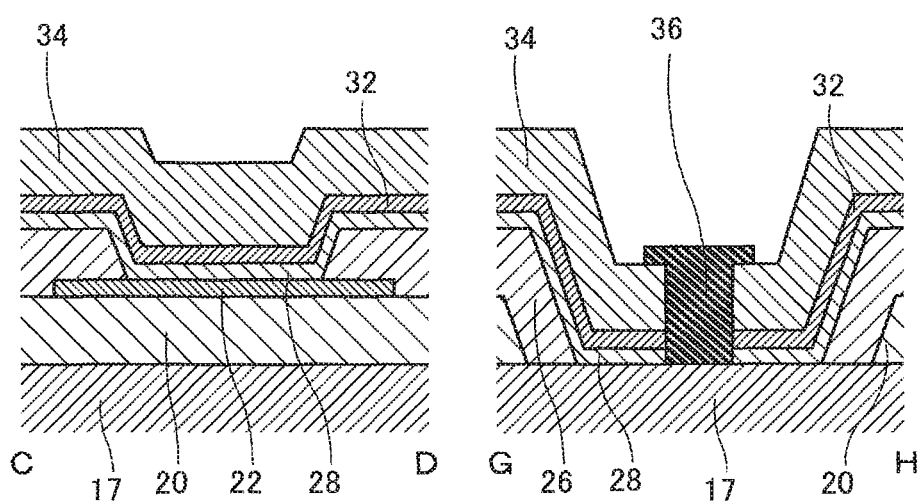
FIG. 6G is a cross-sectional view showing the method for manufacturing the display device 10 in the another embodiment according to the present invention.

In the opening, the contact electrode 36 is formed (FIG. 6G). The contact electrode 36 is preferably formed by, for example, a laser CVD method or an inkjet method. Use of the laser CVD method tends to form a structure in which a metal material is deposited on a side wall and a bottom of the opening. Use of the inkjet method tends to form a structure in which the opening is filled with a metal material.

Figure 6H:
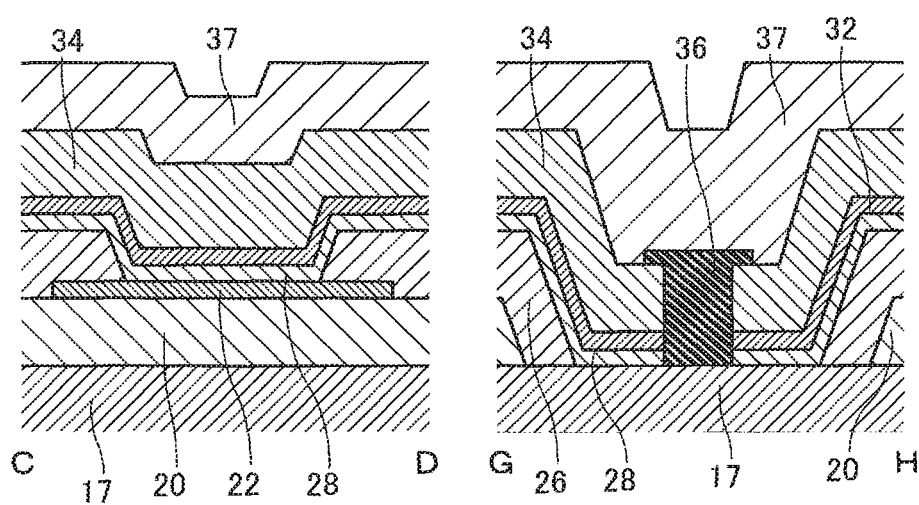
FIG. 6H is a cross-sectional view showing the method for manufacturing the display device 10 in the another embodiment according to the present invention.

The passivation layer 37 is formed (FIG. 6H). The contact electrode 36 and the sealing film 34 are covered with the passivation layer 37. The passivation layer 37 may be formed of an inorganic insulating material or an organic insulating material. Inorganic insulating materials usable for the passivation layer 37 include $SiO_x$, $SiN_x$, $SiO_xN_y$, $SiN_xO_y$, $AlO_x$, $AlN_x$, $AlO_xN_y$, $AlN_xO_y$, formed from TEOS or the like (x and y are each an arbitrary value). The passivation layer 37 may have a stack structure of any of these materials. Organic insulating materials usable for the passivation layer 37 include a polyimide resin, an acrylic resin, an epoxy resin, a silicone resin, a fluorine resin, a siloxane resin and the like. The passivation layer 37 may have a stack structure of any of these materials. The passivation layer 37 may have a stack structure of any of the above-described inorganic insulating materials and any of the above-described organic insulating materials.

In the case where the passivation layer 37 has a stack structure of a plurality of materials, transfer of moisture is further prevented. For example, the passivation layer 37 may have a three-film structure, and a first insulating film (corresponding to a second insulating layer of the display device 10) is formed of an inorganic insulating material. The use of only the first insulating film does not provide a sufficient covering function due to convexed portions and concaved portions provided by the light-emitting elements in the display area 12 and the contact electrode 36, and thus may form a moisture-transferring path. In order to avoid this, a second insulating film (corresponding to a third insulating layer of the display device 10) is formed to provide a high level of flatness. The second insulating film may be formed of an organic insulating material such as an acrylic resin or an inorganic insulating material such as TEOS. On the flattened second insulating film, a third insulating film (corresponding to a fourth insulating layer of the display device 10) is formed. Because of the flattening effect of the second insulating film, the third insulating film has a high coverage and suppresses formation of a moisture-transferring path. The third insulating film is preferably formed of a highly moisture-shielding material, for example, silicon nitride or the like.

The opposite substrate 46 is provided, on the resultant assembly, as being away by a certain distance from the substrate 11 by the sealing member 44 (this step is not shown). In FIG. 5, the opposite substrate 46 is formed of glass. Before the opposite substrate 46 is assembled with the substrate 11, a red color filter 40 corresponding to the red sub pixel, a green color filter 40 corresponding to the green sub pixel, a blue color filter 40 corresponding to the blue sub pixel, and a black matrix 42 provided between the color filters 40 are formed on the opposite substrate 46.

The opposite substrate 46 is bonded with the assembly of the substrate 11 and the components formed thereon, by the filler 38 formed of a resin. As a result, the display device 10 shown in FIG. 2 is manufactured. The filler 38 may be formed of a transparent resin such as a polyimide, an acrylic resin. After being provided between the opposite substrate 46 and the assembly of the substrate 11 and the components formed thereon, the filler 38 may be cured with light.

According to the method for manufacturing the display device 10 in embodiment 2, the organic layer 28 is formed by patterning without a mask. Therefore, the problem that particles are generated due to the contact between the substrate 11 and the mask is avoided. After the organic layer 28 is formed, the common electrode 32 and the sealing film 34 are formed on the organic layer 28, and organic layer 28, the common electrode 32 and the sealing film 34 are patterned in one step. Therefore, dust generated by the patterning are easily removed.

The moisture shielding region 16 enclosing the display area 12 is formed to have the contact electrode 36 in the above-described manner. The moisture shielding region 16 and the sealing member 44 provide a double structure that blocks a moisture-transferring path from outside the display device 10 to the display area 12. In addition, the manufacturing method in embodiment 2 includes a smaller number of times of patterning. These effects improve the yield and productivity.

The display device 10 and the method for manufacturing the same in preferable embodiments according to the present invention have been described. The above-described embodiments and modifications are merely examples, and the technological scope of the present invention is not limited to any of the above-described embodiments or modifications. A person of ordinary skill in the art would make various alterations without departing from the gist of the present invention. Therefore, such alterations are to be construed to be encompassed in the technological scope of the present invention.

The invention claimed is:

1. A display device, comprising:
   a pixel electrode provided in each of a plurality of pixels arrayed on a substrate;
   a common electrode provided commonly to the plurality of pixels;
   an organic layer provided between the pixel electrode and the common electrode;
   a first insulating layer provided on the common electrode;
   a common potential line provided below the organic layer in an area where the first insulating layer; the common electrode and the organic layer are provided in a stacked manner;
   a contact electrode provided in an opening passing through the first insulating layer, the common electrode and the organic layer, the contact electrode being provided on the common potential line; and
   a second insulating layer covering the first insulating layer and the contact electrode.

2. The display device according to claim 1, wherein the contact electrode is located in a peripheral area on the substrate.

3. The display device according to claim 1, wherein the contact electrode is located in a display area on the substrate.

4. The display device according to claim 1, wherein the contact electrode fills the opening.

5. The display device according to claim 1, wherein the contact electrode is located on a side wall and a bottom of the opening.

6. The display device according to claim 1, further comprising:
   a third insulating layer covering the second insulating layer; and
   a fourth insulating layer covering the third insulating layer.

7. The display device according to claim 3, wherein the contact electrode is located in each of at least a part of pixels in the display area on the substrate.

8. A display device, comprising:
   a pixel electrode provided in each of a plurality of pixels arrayed on a substrate;
   an organic layer provided on the pixel electrode;
   a common electrode provided on the organic layer commonly to the plurality of pixels;
   a first insulating layer provided on the common electrode;
   an inorganic insulating layer provided below the organic layer in an area where the first insulating layer, the common electrode and the organic layer are provided in a stacked manner;
   a contact electrode provided in an opening passing through the first insulating layer, the common electrode and the organic layer, the contact electrode being provided on the inorganic insulating layer in a peripheral area enclosing the plurality of pixels; and
   a second insulating layer covering the first insulating layer and the contact electrode.

9. The display device according to claim 8, wherein the contact electrode is located to fill the opening.

10. The display device according to claim 8; wherein the contact electrode is located on a side wall and a bottom of the opening.

11. A method for manufacturing a display device; comprising:
    forming a plurality of pixel electrodes on a first surface of a substrate;
    forming a common potential line on the first surface of the substrate;
    forming an organic layer on a display area of the substrate so as to cover the plurality of pixel electrodes and the common potential line;
    forming a common electrode on the organic layer;
    forming a first insulating layer on the common electrode;
    forming an opening reaching the common potential line;
    forming a contact electrode in the opening; and
    forming a second insulating layer so as to cover the first insulating layer and the contact electrode.

12. The method for manufacturing a display device according to claim 11, wherein the opening is formed by laser irradiation from the side of the first surface of the substrate.

13. The method for manufacturing a display device according to claim 11, wherein the contact electrode is formed in the opening by filing the opening with a metal material.

14. The method for manufacturing a display device according to claim 11, wherein the contact electrode is formed in the opening by attaching a metal material on a side wall and a bottom of the opening.

15. The method for manufacturing a display device according to claim 11, wherein the contact electrode is formed in the opening by a laser CVD method.

16. The method for manufacturing a display device according to claim 11, wherein the contact electrode is formed in the opening by an inkjet method.

17. The method for manufacturing a display device according to claim 11, further comprising: forming a third insulating layer so as to cover the second insulating layer; and forming a fourth insulating layer so as to cover the third insulating layer.

* * * * *